(12) United States Patent
Chondroudis et al.

(10) Patent No.: US 6,730,416 B1
(45) Date of Patent: *May 4, 2004

(54) IONIC SALT DYES AS AMORPHOUS, THERMALLY STABLE EMITTING AND CHARGE TRANSPORT LAYERS IN ORGANIC LIGHT EMITTING DIODES

(75) Inventors: Konstantinos Chondroudis, North White Plains, NY (US); David B. Mitzi, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/396,324

(22) Filed: Sep. 15, 1999

Related U.S. Application Data

(63) Continuation-in-part of application No. 09/349,345, filed on Jul. 8, 1999, now Pat. No. 6,420,056.

(51) Int. Cl.[7] .............................. C09K 11/00; H01J 1/62
(52) U.S. Cl. ........................ 428/690; 428/917; 313/504; 313/506
(58) Field of Search .................. 428/690, 917; 313/504, 505, 506

(56) References Cited

U.S. PATENT DOCUMENTS

| | | | | |
|---|---|---|---|---|
| 3,849,657 A | * | 11/1974 | Hamblen et al. | 250/361 |
| 5,783,292 A | * | 7/1998 | Tokito et al. | 428/212 |
| 5,871,579 A | * | 2/1999 | Liang et al. | 117/68 |
| 5,882,548 A | * | 3/1999 | Liang et al. | 252/301.16 |
| 6,150,536 A | * | 11/2000 | Chondroudis et al. | 549/2 |
| 6,160,267 A | * | 12/2000 | Kunugi et al. | 257/40 |
| 6,194,090 B1 | * | 2/2001 | Okada | 428/690 |
| 6,210,817 B1 | * | 4/2001 | Igarashi | 428/690 |
| 6,215,245 B1 | * | 4/2001 | Mori | 313/506 |

FOREIGN PATENT DOCUMENTS

| | | |
|---|---|---|
| EP | 0 910 100 A2 | 4/1999 |
| JP | 2-250881 | * 10/1990 |
| JP | 04-320484 | 11/1992 |
| JP | 06-271843 | 9/1994 |
| JP | 07-086634 | 3/1995 |
| JP | 08-231536 | 9/1996 |
| JP | 10-511718 | 11/1998 |
| JP | 11-102783 | 4/1999 |
| JP | 11-149-82 | 6/1999 |
| JP | 11-193359 | 7/1999 |

(List continued on next page.)

OTHER PUBLICATIONS

Karasz et al. "Tunable Electroluminescence from Ionomers Doped with Cationic Lumophores", Electrochimica Acta, vol. 43, Nos. 10–11, pp. 1623–1628, 1998.

(List continued on next page.)

Primary Examiner—Cynthia H. Kelly
Assistant Examiner—Dawn Garrett
(74) Attorney, Agent, or Firm—Ohlandt, Greeley, Ruggiero & Perle, L.L.P.; Daniel P. Morris

(57) ABSTRACT

The invention modifies and converts neutral dye molecules (D) to ionic salts (D-$A^+$ $X^-$ or D$A^-$ $X^+$), and employs them as emitting or charge transport layers in organic light emitting diodes (OLED's). This is achieved by attaching ionizable substituents (A) on the dye molecule during initial synthesis, and then reacting it with an appropriate agent that contains charge balancing ions (X). These ionic compounds can be deposited as amorphous films using conventional evaporation techniques. In addition, they are thermally stable to crystallization. OLED devices incorporating such dye salts for emitting layers exhibit superior efficiencies and durability compared with devices using neutral dye molecules.

33 Claims, 5 Drawing Sheets

FOREIGN PATENT DOCUMENTS

| JP | 11-204266 | 7/1999 |
| JP | 11279426 A | 10/1999 |
| JP | 11283750 A | 10/1999 |
| JP | 11-514142 | 11/1999 |
| WO | WO 91/03142 | 3/1991 |
| WO | WO 98/03042 | 1/1998 |
| WO | WO 00/11105 | 3/2000 |

OTHER PUBLICATIONS

"The Use of ionic salt dyes as amorphous, thermally stable emitting layers in organic light–emitting diodes," Applied Physics Letters, vol. 76, No. 1, Jan. 2000, K. Chondroudis and D.B. Mitizi.

Braun et al. "Electroluminescence and electrical transport in Poly (3–Octylthiophene Diodes", p. 564–568, 1992 American Institute of Physics.

Advanced Materials, 1997, vol. 9, No. 9, Tetsuya Noda et al., "A Novel Family of Amorphous Molecular Materials Containing an Oligothiophene Moiety as Color–Tunable Emitting Materials for Organic Electroluminescent Devices".

Elsevier, Synthetic Metals 91 (1997), pp. 209–215, J. Salbeck et al., "Low Molecular Organic Glasses for Blue Electroluminescence".

Elsevier, Thin Solid Films 273 (1996), pp. 202–208, Eun–Mi Han et al., "Crystallization of Organic Thin Films for Electroluminescent Devices".

J. Phys. Chem., vol. A, No. 101, pp. 2350–2357, Katsuyuki Naito et al., "Molecular Design, Syntheses, and Physical Properties of Nonpolymeric Amorphous Dyes for Electron Transport".

* cited by examiner

IONIC SALT DYES AS AMORPHOUS, THERMALLY STABLE EMITTING AND CHARGE TRANSPORT LAYERS IN ORGANIC LIGHT EMITTING DIODES

This application is a Continuation-In-Part of and claims priority from U.S. patent application Ser. No. 09/349,345, filed on Jul. 8, 1999, now U.S. Pat. No. 6,420,056, issued on Jul. 16, 2002, the contents of which are incorporated herein by reference.

FIELD OF THE INVENTION

This invention relates to organic light emitting diodes and, more particularly, to thermally stable, nominally amorphous films for use as emitting layers or charge transport layers in organic light emitting diodes (OLED's). Such films are prepared from dyes that are modified to result in ionic salt analogues.

BACKGROUND OF THE INVENTION

Organic light emitting diodes (OLED's) have attracted broad attention due to their potential for use in display technologies. A few prototype displays have been demonstrated but their widespread use has not occurred because of problems associated with their operational stability and durability.

The degradation of OLED devices has been attributed to chemical changes of the organic layers, such as oxidation, and also to physical changes such as crystallization. Many potentially useful emitting or charge-transporting materials form polycrystalline films when deposited by physical vapor deposition. Such films contain grain boundaries that can act as luminescence quenching sites. To avoid such a problem, deposition of amorphous (glassy state) thin films seems to be a good alternative approach for device fabrication. However, most nonpolymeric organic dye glasses are thermally unstable and crystallize when subjected to driving voltages in a device, causing device failure.

In traditional OLED devices, the emitting organic dye molecules (D) are generally neutral molecules which interact through weak van der Waals interactions. Because of the weak nature of these interactions, heating of the initially amorphous films (for example joule heating when the device is driven, or even heating during deposition) easily causes rearrangement of the molecules, leading to crystallization and grain growth.

The film crystallization problem has been identified by many researchers in the OLED device field. Efforts to synthesize amorphous dyes have been mainly focused on dissolving them in thermally stable amorphous polymers. A second approach is aimed at synthesizing large, symmetric, rigid and dense molecules that will be more heat-resistive (see Naito et al., J. Physical Chemistry, Vol 101, p. 2350 (1997)). An alternative approach is based on the introduction of spiro centers into defined low molecular weight structures (see Salbeck et al., Synthetic Metals, Vol. 91, p. 209 (1997)).

SUMMARY OF THE INVENTION

The invention modifies dyes so as to form ionic salt derivatives. Such derivatives are used as emitting or charge transport layers in organic light emitting diodes (OLED's). The modification involves attachment of ionizable substituents during initial synthesis, followed by formation of an ionic salt. An improvement of the OLED's durability and performance results from use of such ionic dye salts, since the evaporated films are nominally amorphous, thermally stable and resist further crystallization. Preliminary devices built using a test compound exhibit superior efficiency.

DETAILED DESCRIPTION OF THE INVENTION

Figure 1A:
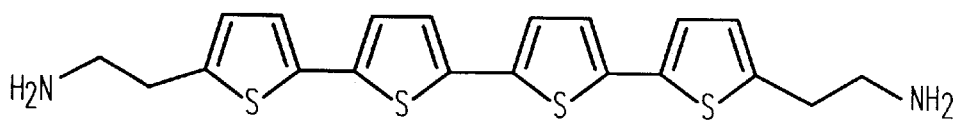
FIG. 1a illustrates a single neutral AEQT molecule.
Figure 1B:
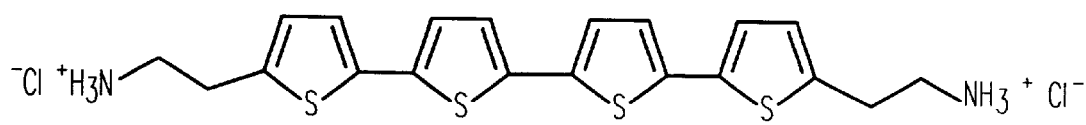
FIG. 1b illustrates the AEQT.2HCl chloride salt of an ionized AEQT molecule.

The invention converts a dye into an ionic salt and uses the salt as an emitting or charge transport layer in an OLED DEVICE. An oligothiophene dye, based on a quaterthiophene oligomer was modified to include two ethylamino terminal groups (ionizable substituents). A schematic representation of the [5,5'''-bis(aminoethyl)-2,2':5',2'':5'',2'''-quaterthiophene (AEQT)] molecule can be seen in FIG. 1a. By reacting AEQT with hydrochloric acid (HCl), the neutral amino groups ($-NH_2$) become positively charged ($-NH_3^+$). To balance the charge, two chloride anions ($Cl^-$) form ionic bonds with the corresponding ammonium cations ($-NH_3^+$). The resulting chloride salt $C_{20}H_{22}S_4N_2Cl_2$ or AEQT.2HCl (FIG. 1b) is the compound used as an emitting layer in an OLED DEVICE.

Figure 2:
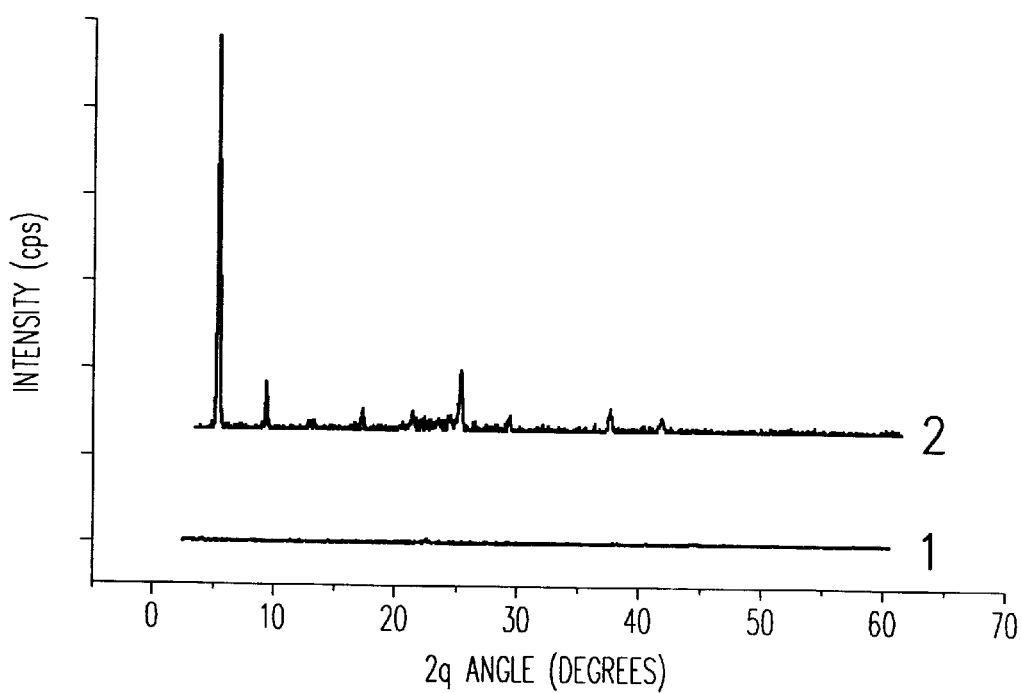
FIG. 2. is a powder X-ray diffraction pattern of an AEQT.2HCl film 1 and of an AEQT film 2.

Deposition of the material as a thin film is accomplished by various inexpensive, low temperature methods such as spin-coating, or thermal evaporation. In this case a single-source, thermal ablation technique (disclosed in copending U.S. patent application, Ser. No. 09/192,130 to Chondroudis et al., assigned to the same Assignee as this Application) was employed for the deposition of nominally amorphous thin films. The powder X-ray diffraction pattern (as shown at 1 in FIG. 2) of an as-deposited films was almost featureless, indicating an amorphous or very fine grained film. The same pattern was obtained after thermal annealing at 90° C. and 135° C. Presumably, this is because the molecules in the salt interact via strong ionic interactions, as well as through van der Waals forces.

The stronger bonding is expected to impede rearrangement of the dye molecules during and after thin film deposition. For comparison, the AEQT dye was evaporated without converting it to a salt. As shown at 2 in FIG. 2, the film is crystalline and well ordered, even without annealing. In fact, attempts to make OLEDs using such films failed. This was due to the granular nature of these crystalline films which could not be properly covered with a top metal electrode, thereby producing inhomogeneous fields and electrically shorted devices.

Figure 3A:
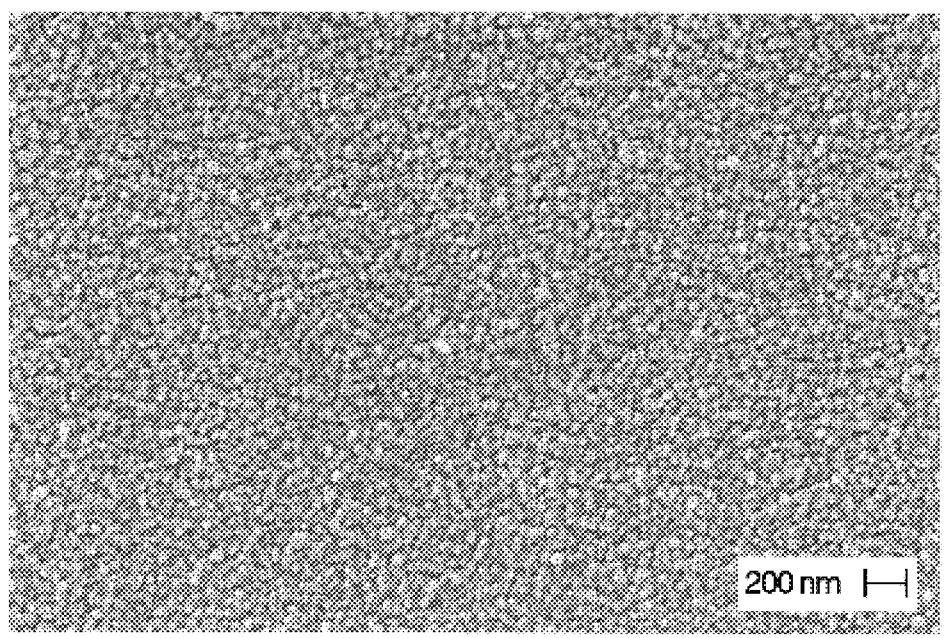
FIG. 3a is a scanning electron microscope (SEM) picture of an AEQT.2HCl film.
Figure 3B:
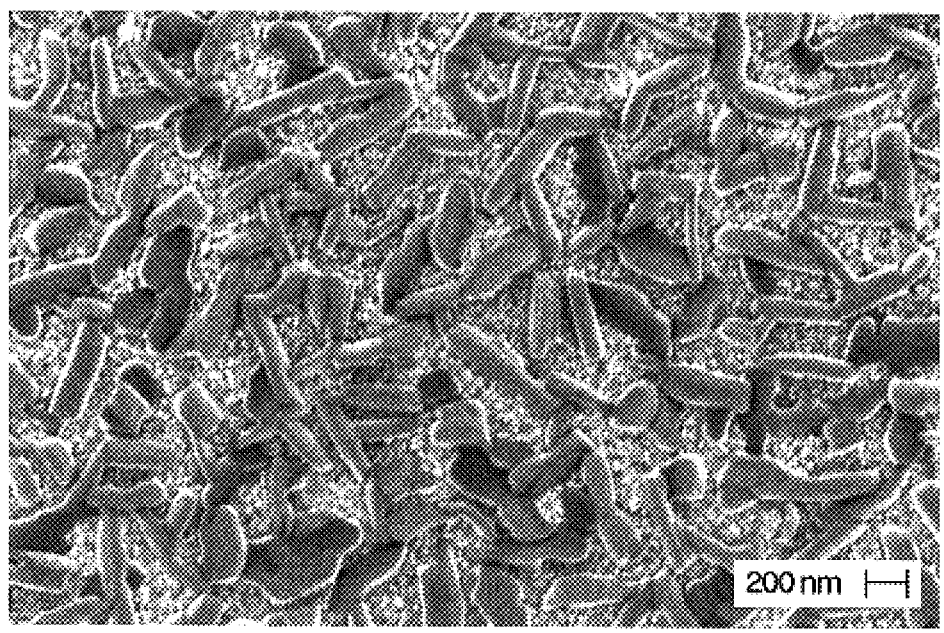
FIG. 3b is a scanning electron microscope (SEM) picture of an AEQT film.

To further establish the ability of the method of the invention to provide amorphous films, scanning electron microscopy (SEM) was used to study the morphological properties of the films. As shown, in FIG. 3a, AEQT.2HCl films have a very homogeneous and fine grained (<~50 nm) structure that is ideal for devices. On the other hand, AEQT films have very irregular surfaces with big grain sizes (~500 nm), making them inappropriate for device fabrication (FIG. 3b).

Figure 4A:
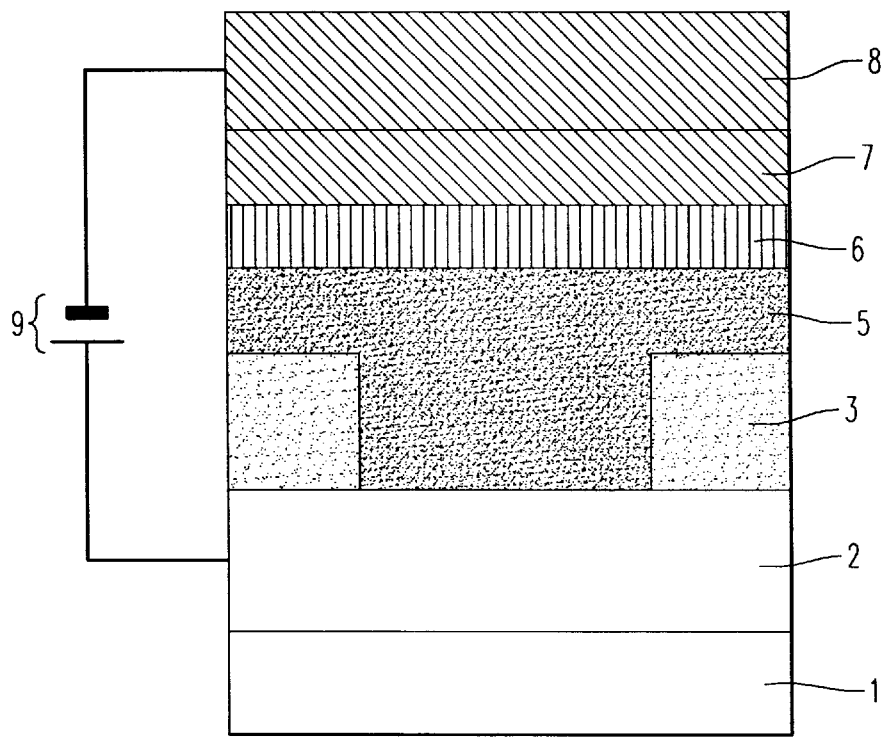
FIG. 4a is a schematic cross-section of an OLED device incorporating an AEQT.2HCl dye salt as the emitting layer.
Figure 4B:
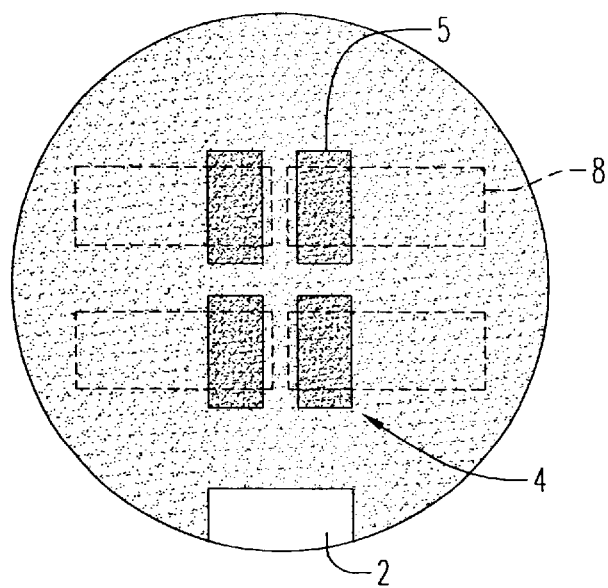
FIG. 4b is a schematic bottom view of a substrate showing four device areas.

The structure of a typical OLED DEVICE using a dye salt, as prepared in accord with the invention, is shown in FIG. 4. As a substrate, an optically smooth quartz substrate 1 was used. A transparent anode comprised a 1500 Angstroms thick layer 2 of indium tin oxide (ITO), that was evaporated on top of the substrate. A 1200 Angstroms thick silicon dioxide layer 3 was then evaporated through a contact mask in order to define four device areas 4 on top of the ITO layer 2 (shown in FIG. 4b). The emitting layer 5, consisting of the $C_{20}H_{22}S_4N_2Cl_2$ salt, was deposited next using the single source thermal ablation technique (2400 Angstroms). This was followed by thermal annealing of the samples at 90° C. for 15 minutes and at 135° C. for 2 minutes.

Next a thin layer of the electron transporting agent OXD7 6 was thermally deposited (300 Angstroms) and finally, the device was completed by thermally depositing the cathode. The latter consisted of a magnesium-silver alloy (25:1) 7, which provides for a low work-function cathode, capped by 1200 Angstroms of pure silver 8 to inhibit air oxidation. The deposition of the OXD7 and of the cathode were performed in a vacuum system by thermal evaporation.

Figure 5A:
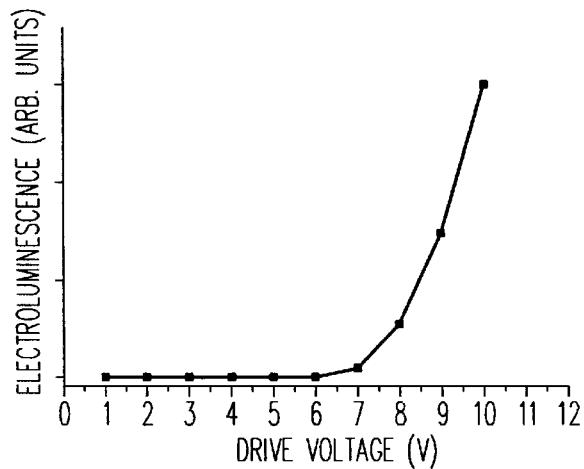
FIG. 5a is a plot of electroluminescence versus drive voltage for the OLED device shown in FIG. 4.
Figure 5B:
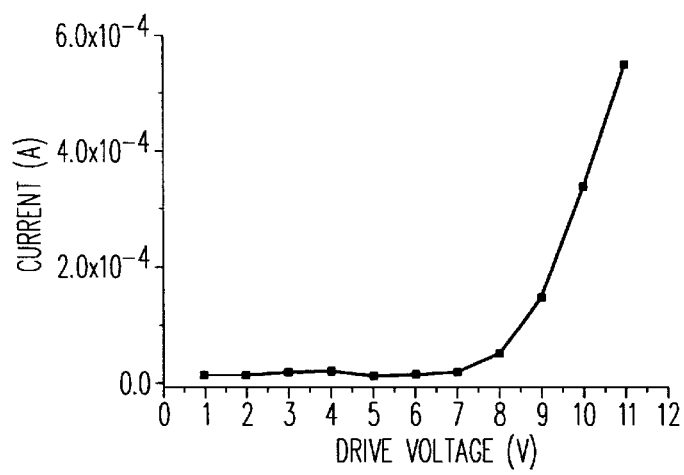
FIG. 5b is a plot of current versus drive voltage for the OLED device shown in FIG. 4.
Figure 5C:
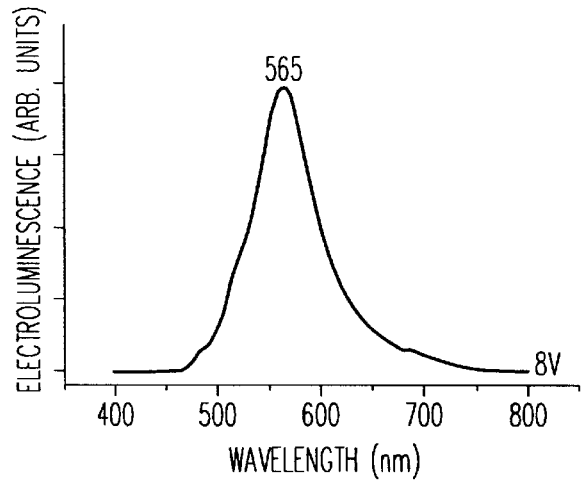
FIG. 5c is a plot of the electroluminescence spectrum for the OLED device shown in FIG. 4.

When a voltage 9 is applied across the device, green electroluminescence is readily observed under normal lighting conditions and at room temperature. Device characterization data of this device is shown in FIG. 5. Although unoptimized, the device exhibits low turn-on voltages (less than 9 V) and a high efficiency of 0.25 lm/W.

Previous work by Noda et al. on thin semiconducting films of oligothiophenes yielded devices with inferior efficiencies ($10^{-4}$ to $10^{-8}$ lm/W) due to the fact that such films were well ordered and crystalline. By using triphenyl-amino substituted quaterthiophenes to reduce crystallinity, higher efficiencies of 0.03 lm/W were obtained (see Noda et al., Adv. Materials, Vol. 9, p 720 (1997)). Those reported efficiencies are lower, however, than the efficiencies exhibited by devices made in accord with the invention hereof.

The foregoing device description is only illustrative of the invention. The technique can be extended to hole and electron transport layers of an OLED DEVICE which includes similar organic molecules to those found in the emitting layer and which are also prone to crystallization. In typical OLED devices, either a single charge transport layer is used (electron or hole transporting) or both may be used to enhance charge injection into the organic emission layer.

In summary, instead of using a neutral dye molecule (D), the invention modifies a dye during its synthesis to contain ionizable substituents (A) to give (D-A). An ionic salt ($DA^+ X^-$ or $DA^- X^+$) of the dye is then synthesized by application of an appropriate reactant which contains charge balancing ions (X). When deposited in the form of films, the ionic salts are typically amorphous as opposed to the crystalline films of the neutral dye. In addition, the ionic salt films remain amorphous even when heated to higher temperatures (indicating thermal stability). These ionic salts are used as the emitting layer in OLED devices, which are more efficient and robust than the corresponding neutral dye devices.

Various alternatives can be devised by modifying the components of the ($DA^+ X^-$) dye salt. The most important modification is the appropriate selection of different dyes (D) that define the emission properties of the device (color, intensity). Potential candidates, for example, include derivatives of the tolan, thioxanthone, coumarin, rhodamine and perylene families and the present invention is intended to embrace all such alternatives. This allows preparation of devices with different colors and enables realization of a full color display.

Figure 6:
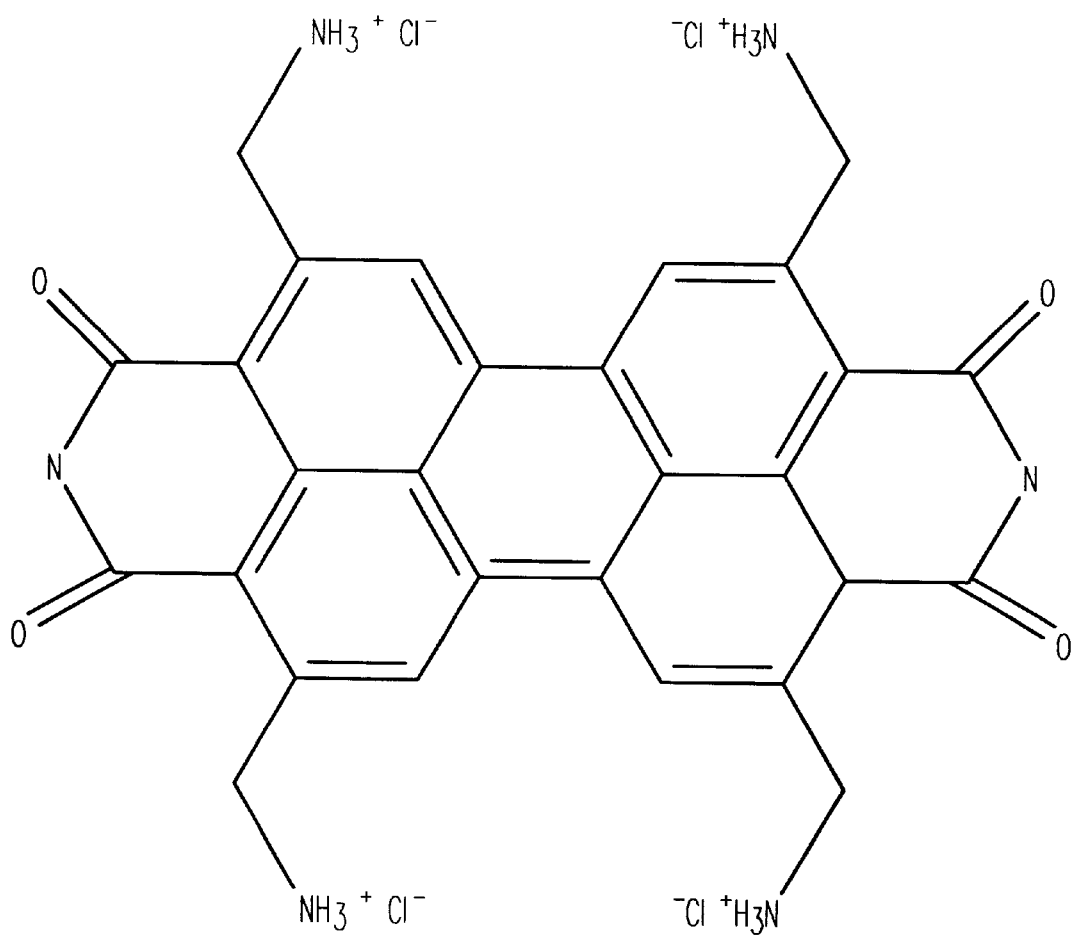
FIG. 6. is a perylene derivative modified to contain four substituents.

Other factors that can be modified include the use of different ionic substituents (A) and charge balancing ions (X). The charge balancing ion can be either an organic or an inorganic entity. The number of ionic substituents (A) attached to a molecule is also important in the glass forming properties of the resulting films. Since it is believed that the ionic forces present in the salt are responsible for the lack of crystallinity, then by using a larger number of ionic substituents (A), more thermally stable films can be formed. An example is given FIG. 6, in which a perylene derivative has been modified to contain four substituents, to form a $(D-A^+_4)X^-_4$ salt.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An electroluminescent device comprising: an anode, a cathode and an emitting layer disposed between said anode and said cathode, said emitting layer comprising an organic dye salt material that includes an organic dye containing an ionizable substituent ionized to carry a charge and a counterion to balance said charge.

2. The device of claim 1 wherein said organic dye salt material fluoresces in the visible range.

3. The device of claim 1 wherein said organic dye is selected from the group consisting of: derivatives of tolan, thioxanthone, coumarin, perylene, pyrene, oxadiazole, polyenes, oligothiophenes, oligophenylenes, phenylene vinylenes, thiophene vinylenes and mixtures thereof.

4. The device of claim 1 wherein said organic dye is a quaterthiophene derivative.

5. The device of claim 1 wherein said ionizable substituent is selected from functional groups consisting of: amino-, hydroxy-, oxo-, nitro-, sulfo-, carboxy-, and phosph-.

6. The device of claim 1 wherein said ionizable substituent is an alkylamine.

7. The device of claim 1 wherein said ionizable substituent is ethylamine.

8. The device of claim 1 wherein said counterion is selected from the group consisting of: halides, alkali metal cations, and alkaline earth cations.

9. The device of claim 1 wherein said counterion is an organic ion containing an ionized form of one or more following functional groups: amino-, hydroxy-, oxo-, nitro-, sulfo-, carboxy-, phosphor.

10. An electroluminescent device comprising: an anode, a cathode, an emitting layer, and at least one charge transport layer disposed adjacent to said emitting layer and between said anode and said cathode and comprising an organic dye salt material that includes an organic dye containing an ionizable substituent ionized to carry a charge and a counterion to balance said charge.

11. The device of claim 10 wherein said charge transport layer includes molecules selected from the group consisting of: derivatives of tolan, thioxanthone, coumarin, perylene, pyrene, oxadiazole, polyenes, ligothiophenes, oligophenylenes, phenylene vinylenes, hiophene vinylenes and mixtures thereof.

12. The device of claim 10 wherein said ionizable substituent is selected from functional groups consisting of: amino-, hydroxy-, oxo-, nitro-, sulfo-, carboxy-, and phospho-.

13. The device of claim 10 wherein said ionizable substituent is an alkylamine.

14. The device of claim 10 wherein said ionizable substituent is ethylamine.

15. The device of claim 10 wherein said counterion is selected from the group consisting of: halides, alkali metal cations, and alkaline earth cations.

16. The device of claim 10 wherein said counterion is an organic ion containing the ionized form of one or more of the following functional groups: amino-, hydroxy-, oxo-, nitro-, sulfo-, carboxy-, phosphor.

17. The electroluminescent device of claim 1, wherein said counterion is inorganic.

18. The electroluminescent device of claim 10, wherein said counterion is inorganic.

19. An electroluminescent device comprising: an anode, a cathode and an emitting layer disposed between said anode and said cathode, said emitting layer comprising an organic dye containing an ionizable substituent ionized to carry a charge and a counterion to balance said charge.

20. The electroluminescent device of claim 19, wherein said counterion is inorganic.

21. An electroluminescent device comprising: an anode, a cathode, an emitting layer, and at least one charge transport layer disposed adjacent to said emitting layer and between said anode and said cathode and comprising an organic dye containing an ionizable substituent ionized to carry a charge and a counterion to balance said charge.

22. The electroluminescent device of claim 21, wherein said counterion is inorganic.

23. The device of claim 1, wherein said charge of said ionizable substituent is a positive charge.

24. The device of claim 10, wherein said charge of said ionizable substituent is a positive charge.

25. The device of claim 1, wherein said charge of said ionizable substituent is a negative charge.

26. The device of claim 10, wherein said charge of said ionizable substituent is a negative charge.

27. An electroluminescent device comprising: an anode, a cathode and an emitting layer disposed between said anode and said cathode, said emitting layer comprising an organic dye salt material that includes an organic dye containing an ionizable substituent and a counterion to balance a charge of the organic dye.

28. An electroluminescent device comprising: an anode, a cathode, an emitting layer, and at least one charge transport layer disposed adjacent to said emitting layer and between said anode and said cathode and comprising an organic dye salt material that includes an organic dye containing an ionizable substituent and a counterion to balance a charge of the organic dye.

29. An electroluminescent device comprising: an anode, a cathode an emitting layer disposed between said anode and said cathode, said emitting layer comprising an organic dye salt material that includes an organic dye containing an ionizable substituent ionized to carry a charge and a counterion to balance said charge, wherein said organic dye is selected from the group consisting of: derivatives of tolan, thioxanthone, coumarin, perylene, pyrene, oxadiazole, polyenes, oligothiophenes, oligophenyleries, phenylene vinylenes, thiophene vinylenes and mixtures thereof.

30. The device of claim 29, wherein said organic dye is a quaterthiophene derivative.

31. The device of claim 29, wherein said ionizable substituent is an alkylamine.

32. The device of claim 29, wherein said ionizable substituent is ethylamine.

33. An electroluminescent device comprising: an anode, a cathode and an emitting layer disposed between said anode and said cathode, said emitting layer comprising an organic dye salt material that includes an organic dye containing an ionizable substituent ionized to carry a charge and a counterion to balance said charge, wherein said electroluminescent device operates by application of an electric field between said anode and said cathode to produce electroluminescence from said emitting layer.

* * * * *